(12) United States Patent
Smith

(10) Patent No.: US 10,487,403 B2
(45) Date of Patent: Nov. 26, 2019

(54) FLUORO-CONTAINING THERMAL CHEMICAL VAPOR DEPOSITION PROCESS AND ARTICLE

(71) Applicant: SILCOTEK CORP., Bellefonte, PA (US)

(72) Inventor: David A. Smith, Bellefonte, PA (US)

(73) Assignee: SILCOTEK CORP, Bellefonte, PA (US)

( * ) Notice: Subject to any disclaimer, the term of this patent is extended or adjusted under 35 U.S.C. 154(b) by 145 days.

(21) Appl. No.: 15/377,657

(22) Filed: Dec. 13, 2016

(65) Prior Publication Data

US 2018/0163308 A1 Jun. 14, 2018

(51) Int. Cl.
*C23C 16/40* (2006.01)
*C23C 16/56* (2006.01)
(Continued)

(52) U.S. Cl.
CPC ............... *C23C 16/56* (2013.01); *B05D 5/08* (2013.01); *B08B 17/02* (2013.01); *B32B 15/00* (2013.01);
(Continued)

(58) Field of Classification Search
CPC .. B05D 5/08; B05D 5/086; B05D 1/62; B08B 17/00; B08B 17/02; B08B 17/025;
(Continued)

(56) References Cited

U.S. PATENT DOCUMENTS

| 4,173,661 A | 11/1979 | Bourdon |
| 4,579,752 A | 4/1986 | Dubois et al. |

(Continued)

FOREIGN PATENT DOCUMENTS

JP 2013227628 A * 11/2013

OTHER PUBLICATIONS

Wang et al., Environmental Applications of Interfacial Materials with Special Wettability, Environmental Science & Technology, 2016.*

(Continued)

*Primary Examiner* — Z. Jim Yang
(74) *Attorney, Agent, or Firm* — McNees Wallace & Nurick LLC

(57) ABSTRACT

Thermal chemical vapor deposition treatment is disclosed. Specifically, a thermal chemical vapor deposition treated article includes a substrate, and an oleophobic treatment to the substrate, the oleophobic treatment having oxygen, carbon, silicon, fluorine, and hydrogen. The oleophobic treatment has a treatment thickness of less than 600 nm and a heterogeneous wetting regime. The thermal chemical vapor deposition process includes positioning an article within a thermal chemical vapor deposition chamber, thermally reacting dimethylsilane to produce a layer, oxidizing the layer to produce an oxidized layer, and fluoro-functionalizing the oxidized layer to produce an oxidized then fluoro-functionalizing dimethylsilane chemical vapor deposition treatment. The oxidized then fluoro-functionalizing dimethylsilane chemical vapor deposition treatment has a treatment thickness of less than 600 nm and a heterogeneous wetting regime.

17 Claims, 1 Drawing Sheet

(51) Int. Cl.
    *C23C 16/24*     (2006.01)
    *B32B 15/00*     (2006.01)
    *B05D 5/08*     (2006.01)
    *B08B 17/02*     (2006.01)
    *C23C 16/455*     (2006.01)

(52) U.S. Cl.
    CPC .......... *C23C 16/24* (2013.01); *C23C 16/401* (2013.01); *C23C 16/402* (2013.01); *C23C 16/45523* (2013.01)

(58) Field of Classification Search
    CPC ..... C23C 16/40; C23C 16/401; C23C 16/402; C23C 16/22–42; B32B 15/00–20; Y10T 428/13
    See application file for complete search history.

(56) References Cited

U.S. PATENT DOCUMENTS

| | | | |
|---|---|---|---|
| 4,671,997 A | 6/1987 | Galasso et al. | |
| 4,714,632 A | 12/1987 | Cabrera et al. | |
| 4,741,964 A | 5/1988 | Haller | |
| 4,749,631 A | 6/1988 | Haluska et al. | |
| 4,753,856 A | 6/1988 | Haluska et al. | |
| 4,792,460 A | 12/1988 | Chu et al. | |
| 4,842,888 A | 6/1989 | Haluska et al. | |
| 5,160,544 A | 11/1992 | Garg et al. | |
| 5,250,451 A | 10/1993 | Chouan | |
| 5,299,731 A | 4/1994 | Liyanage et al. | |
| 5,480,677 A | 1/1996 | Li et al. | |
| 5,481,135 A | 1/1996 | Chandra et al. | |
| 5,562,952 A | 10/1996 | Nakahigashi et al. | |
| 5,563,102 A | 10/1996 | Michael | |
| 5,818,071 A | 10/1998 | Loboda et al. | |
| 5,825,078 A | 10/1998 | Michael | |
| 6,159,871 A | 12/2000 | Loboda et al. | |
| 6,203,898 B1* | 3/2001 | Kohler | B05D 1/62 428/339 |
| 6,280,834 B1* | 8/2001 | Veerasamy | B05D 5/083 428/212 |
| 6,312,808 B1 | 11/2001 | Veerasamy et al. | |
| 6,416,816 B2 | 7/2002 | Veerasamy et al. | |
| 6,444,326 B1* | 9/2002 | Smith | C09D 183/16 427/255.11 |
| 6,472,076 B1* | 10/2002 | Hacker | C07F 7/21 427/255.36 |
| 6,511,760 B1 | 1/2003 | Barone et al. | |
| 6,531,182 B2 | 3/2003 | Veerasamy et al. | |
| 6,531,398 B1 | 3/2003 | Gaillard et al. | |
| 6,593,655 B1 | 7/2003 | Loboda et al. | |
| 7,070,833 B2 | 7/2006 | Smith et al. | |
| 7,867,627 B2* | 1/2011 | Smith | C23C 16/24 428/428 |
| 8,286,571 B2 | 10/2012 | Driver et al. | |
| 9,777,161 B1* | 10/2017 | Campos | C09C 3/12 |
| 2004/0037956 A1 | 2/2004 | Yang | |
| 2004/0175579 A1 | 9/2004 | Smith et al. | |
| 2006/0216952 A1 | 9/2006 | Bhanap et al. | |
| 2007/0202340 A1* | 8/2007 | Tamitsuji | B05D 1/62 428/421 |
| 2008/0095954 A1* | 4/2008 | Gabelnick | B05D 1/62 427/579 |
| 2008/0096014 A1* | 4/2008 | Griesser | B05D 1/62 428/336 |
| 2008/0145528 A1* | 6/2008 | Deng | B05D 1/60 427/180 |
| 2009/0202817 A1* | 8/2009 | Durandeau | B05D 1/62 428/332 |
| 2010/0068434 A1* | 3/2010 | Steele | C09D 133/16 428/36.9 |
| 2010/0316842 A1* | 12/2010 | Tuteja | D01D 5/003 428/143 |
| 2011/0008525 A1* | 1/2011 | Dalakos | B05D 1/62 427/2.11 |
| 2012/0045954 A1* | 2/2012 | Bleecher | C09K 3/18 442/80 |
| 2012/0051018 A1* | 3/2012 | Ollgaard | B05D 1/62 361/781 |
| 2012/0219727 A1* | 8/2012 | Gandhiraman | B01L 3/502707 427/563 |
| 2012/0251797 A1* | 10/2012 | Smith | C23C 16/325 428/195.1 |
| 2013/0044162 A1* | 2/2013 | Zhao | B41J 2/1433 347/44 |
| 2013/0244025 A1* | 9/2013 | Smith | C23C 16/0272 428/336 |
| 2013/0280485 A1* | 10/2013 | Coclite | C09D 133/16 428/141 |
| 2013/0302595 A1* | 11/2013 | Liu | C03C 17/007 428/336 |
| 2014/0113146 A1* | 4/2014 | Haack | B05D 5/068 428/425.5 |
| 2014/0137976 A1* | 5/2014 | Miller | E21B 17/00 138/145 |
| 2014/0193594 A1* | 7/2014 | Tanaka | C23C 16/26 428/34.1 |
| 2014/0342103 A1* | 11/2014 | Petersen | B05D 5/083 427/569 |
| 2014/0370300 A1* | 12/2014 | Smith | B05D 1/60 428/422 |
| 2015/0024152 A1* | 1/2015 | Carr | B01D 15/22 428/34.1 |
| 2015/0030885 A1* | 1/2015 | Smith | C23C 16/0218 428/688 |
| 2015/0064376 A1* | 3/2015 | Smith | B05D 5/083 428/34.1 |
| 2015/0065001 A1* | 3/2015 | Coulson | B05D 5/083 442/59 |
| 2015/0147495 A1* | 5/2015 | Kumar | B32B 1/08 428/34.1 |
| 2015/0153642 A1* | 6/2015 | Yang | B81C 1/00206 430/11 |
| 2015/0225608 A1* | 8/2015 | Kim | C01B 33/12 428/161 |
| 2015/0283307 A1* | 10/2015 | Smith | C23C 16/44 428/34.1 |
| 2016/0059260 A1* | 3/2016 | Smith | B05D 5/083 428/34.1 |
| 2016/0096845 A1* | 4/2016 | Celia | B32B 5/14 508/106 |
| 2016/0122558 A1* | 5/2016 | Haddad | C07F 7/21 524/263 |
| 2016/0181089 A1* | 6/2016 | Liang | B81B 3/00 438/778 |
| 2016/0243587 A1* | 8/2016 | Kanungo | B41J 2/165 |
| 2017/0029663 A1* | 2/2017 | Selwyn | B05D 3/007 |
| 2017/0056834 A1* | 3/2017 | Bhushan | B01D 69/02 |
| 2017/0267577 A1* | 9/2017 | Wang | C03C 17/28 |
| 2017/0282227 A1* | 10/2017 | Eder | B08B 17/00 |
| 2017/0283943 A1* | 10/2017 | Smith | B32B 15/04 |
| 2018/0009001 A1* | 1/2018 | Paxson | B05D 1/60 |
| 2018/0118957 A1* | 5/2018 | Brown | C09D 5/1693 |
| 2018/0161810 A1* | 6/2018 | Reihs | B05D 1/185 |
| 2018/0178249 A1* | 6/2018 | Ma | B05D 3/007 |

OTHER PUBLICATIONS

G.A. Barone, D.A. Smith and M. Higgins, "Anti-Corrosive and Anti-Coking Properties of Unique Surface Coatings for Metal Substrates in Petrochemical Service," www.restekcorp.com, obtained Feb. 2015, 19 pgs.

G.A. Barone, D.A. Smith and D. Shelow, "Advantages to Using Inert, Coated Components for Sampling & Measurement of Organo-Sulfur Compounds," www.restekcorp.com, obtained Feb. 2015, 17 pgs.

D.A. Smith, M. Higgins and G. Barone, "Evaluation of System Surfaces in Low-Level Sulfur Analysis for the Petrochemical Industry," www.restekcorp.com, obtained Feb. 2015, 37 pgs.

J. De Zeeuw, G. Barone and M. Higgins, "Comparing Surface

(56) References Cited

OTHER PUBLICATIONS

Adsorption Effects During the Analysis of Mercury and Sulfur Containing Streams," www.restekcoatings.com, obtained Feb. 2015, 30 pgs.

G. Gerhab and A. Schuyler, "Efficient and Rapid GC Analysis With Rugged Metal Microbore Capillary Columns," www.restekcorp.com, obtained Feb. 2015, 18 pgs.

J. De Zeeuw, "Deactivation of Metal Surfaces: Applications in Gas Chromatography (GC) for the Past 15 Years," American Laboratory, Nov. 2012, 10 pgs.

D.A. Smith and J.B. Mattzela, The Deposition and Functionalization of Silicon-Based Materials to Prevent Surface Corrosion, Adsorption, Contamination and Catalytic Interactions, MS&T'09, Oct. 2009, 21 pgs.

G. Barone, D.Smith and M. Higgins, "Selection of Surface Coatings for Process Lines and Equipment Used in Corrosive and Reactive Streams", Analytical Solutions for Energy Optimization & Environmental Compliance, The 54th Annual Symposium of the Analysis Division, Apr. 2009, 17 pgs.

G. Barone, D. Smith, M. Higgins and T. Neeme, "Study of Chemical and Physical Adsorption Properties of Moisture, Sulfur, and Mercury Streams Through a Variety of Tubing Substrates," ISA 53rd Analysis Division Symposium, 2008, 9 pgs.

J. Choi et al., "Self-Assembled Monolayers as Lubricants for Magnetic Disk Drives," IEEE Transactions on Magnetics, vol. 41, No. 2, Feb. 2005, pp. 599-603.

Fast Facts At-a-Glance Product Information from Restek, Silcosteel-CR, Achieve Specialty Alloy Performance Using Austenitic Stainless Steels, www.restekcorp.com, 2004, 4 pgs.

J. Choi, et al. "Self-Assembled Monolayer on Diamond-like Carbon Surface: Formation and Friction Measurements," Tribology International 36, 2003. pp. 285-290.

R.L. Firor and B.D. Quimby, "Dual-Channel Gas Chromatographic System for the Determination of Low-Level Sulfur in Hydrocarbon Gases," Agilent Technologies, Inc., Mar. 2003, 10 pgs.

Restek Performance Coatings Service Through Technology, www.restekcorp.com, 2003, 1 pg.

D.A. Smith, D. Shelow and G. Barone, "Instrument and Sampling Equipment Passivation Requirements to Meet Current Demands for Low-Level Sulfur Analysis," 2001, 37 pgs.

Fast Facts At-a-Glance Product Information from Restek, Silcosteel-UHV, Dramatically Reduce Outgassing in UHV Systems, www.restekcorp.com, 2001, 2 pgs.

D.A. Smith, G.B. Stidsen, B. Burger and D. Shelow, "The Containment and Transfer of Trace Sulfur Gases at Low-PPBV Levels," 2001, 37 pgs.

R.L. Firor, "Use of GC/MSD for Determination of Volatile Sulfur: Application in Natural Gas Fuel Cell Systems and Other Gaseous Streams," Agilent Technologies, Inc., Nov. 2001, 10 pgs.

G.G. Gerhab and A. Schuyler, "Highly Inert Sample Pathways," 1996, 16 pgs.

A. Schuyler, J.W. Stauffer, C.E. Loope and C.R. Vargo, "Highly Efficient and Inert Stainless Steel GC Columns: A Durable, Flexible Alternative to Fused Silica," Elsevier Science Publishers, 1992, 6 pgs.

W. Bertsch and V. Pretorius, "Deactivation of Metal Surfaces for Capillary Columns for GC by Deposition of Silicon," Journal of HRC&CC, 1982, 3 pgs.

V. Pretorius and J.D. Du Toit, "Gas Chromatography in Glass and Fused Silica Capillary Columns: Deactivation of the Inner Surface Using Silicon Films," Journal of HRC & CC, 1981, 2 pgs.

* cited by examiner

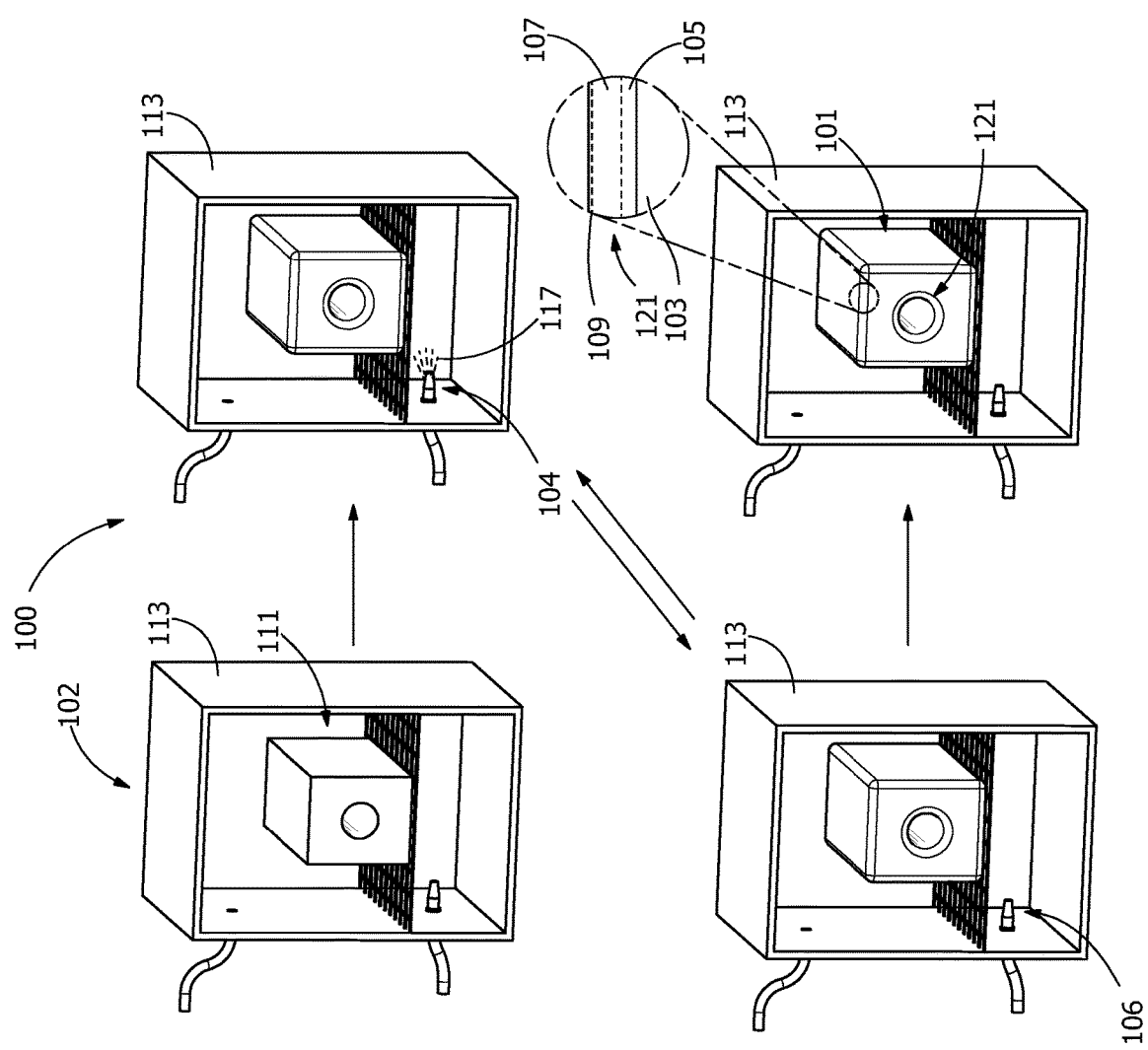

FLUORO-CONTAINING THERMAL CHEMICAL VAPOR DEPOSITION PROCESS AND ARTICLE

FIELD OF THE INVENTION

The present invention is directed to fluoro-containing thermal chemical vapor deposition. More particularly, the present invention is directed to fluoro-containing thermal chemical vapor deposition processes and fluoro-containing thermal chemical vapor deposition treated articles.

BACKGROUND OF THE INVENTION

Treatment processes are an important way to achieve surface properties, which can have significant impact on the performance of a component. As used herein, the term "treatment," and grammatical variations thereof, is intended to encompass growth or application of material (for example, coating) and surface modifications through use of a chemical (for example, functionalization).

Known treatments include material being applied to various surfaces through thermal chemical vapor deposition. Such materials are generally applied in flow-through systems that involve constant flow of a gas through a reaction chamber, which do not include the gaseous soak and include features that do not allow conditions for flow-through systems to translate to conditions for systems that are not flow-through. Some application has been through static processes involving pump and purge cycling of a reaction vessel, with periods of a gaseous soak within the reaction vessel.

Flow-through processes allow for a constant or substantially constant concentration of a precursor fluid to contact a surface, which is desirable because it allows for coatings to be applied with no gas phase nucleation. However, such flow-through processes are limited to line-of-sight techniques that coat surfaces within a direct line or substantially close to the direct line. Such flow-through processes are expensive and wasteful by having an over-abundance of the gas precursor that does not deposit on such surfaces.

Atomic layer deposition allows coating of regions that are not line-of-sight or close to a direct line. However, atomic layer deposition is a single layer process that has substantial economic challenges due to the prolonged processing conditions required to achieve coating.

Prior techniques of using thermal chemical vapor deposition have addressed above drawbacks of flow-through techniques and atomic layer deposition. The comparative precision of flow-through techniques, such as plasma-enhanced chemical vapor deposition, has caused certain extremely sensitive industries to believe that thermal chemical vapor deposition is not an option. Such industries have previously considered the sensitivity to be beyond the functional possibility for thermal chemical vapor deposition and only capable of being satisfied through wasteful flow-through techniques.

Prior techniques involving thermal chemical vapor deposition have focused on a broad range of thicknesses. Coatings with greater thicknesses, for example, exceeding 800 nm, have been considered desirable. However, such coatings have had undesirable properties corresponding with homogeneous wetting regimes.

Thermal chemical vapor deposition processes and thermal chemical vapor deposition treated articles that show one or more improvements in comparison to the prior art would be desirable in the art.

BRIEF DESCRIPTION OF THE INVENTION

In an embodiment, a thermal chemical vapor deposition treated article includes a substrate, and an oleophobic treatment to the substrate, the oleophobic treatment having oxygen, carbon, silicon, fluorine, and hydrogen. The oleophobic treatment has a treatment thickness of less than 600 nm and a heterogeneous wetting regime.

In another embodiment, a thermal chemical vapor deposition treated article includes a substrate, and an oleophobic treatment to the substrate, the oleophobic treatment having oxygen, carbon, silicon, fluorine, and hydrogen. The oleophobic treatment has a roughness ratio of 1, the roughness ratio being the true surface area of the oleophobic treatment divided by an apparent surface area during hexadecane contact angle measurement.

In another embodiment, a thermal chemical vapor deposition process includes positioning an article within a thermal chemical vapor deposition chamber, thermally reacting dimethylsilane to produce a layer, oxidizing the layer to produce an oxidized layer, and fluoro-functionalizing the oxidized layer to produce an oxidized then fluoro-functionalized dimethylsilane chemical vapor deposition treatment. The oxidized then fluoro-functionalized dimethylsilane chemical vapor deposition treatment has a treatment thickness of less than 600 nm and a heterogeneous wetting regime.

Other features and advantages of the present invention will be apparent from the following more detailed description, taken in conjunction with the accompanying drawings which illustrate, by way of example, the principles of the invention.

BRIEF DESCRIPTION OF THE DRAWINGS

The FIGURE is a schematic perspective view of a thermal chemical vapor deposition process, according to an embodiment of the disclosure.

Wherever possible, the same reference numbers will be used throughout the drawings to represent the same parts.

DETAILED DESCRIPTION OF THE INVENTION

Provided are thermal chemical vapor deposition processes and thermal chemical vapor deposition treated articles. Embodiments of the present disclosure, for example, in comparison to concepts failing to include one or more of the features disclosed herein, increase consistency/repeatability of treatment, improve aesthetics, modify microstructure, modify optical properties, modify porosity, modify corrosion resistance, modify gloss, modify surface features, permit more efficient production of treatments, permit treatment of a wide range of geometries (for example, narrow channels/tubes, three-dimensionally complex geometries, and/or hidden or non-line-of-site geometries, such as, in needles, tubes, probes, fixtures, complex planar and/or non-planar geometry articles, simple non-planar and/or planar geometry articles, and combinations thereof), reduce or eliminate defects/microporosity, permit treatment of a bulk of articles, are capable or being used in or replacing components that are used in industries traditionally believed to be too sensitive for processes that are not flow-through processes (for example, based upon compositional purity, presence of contaminants, thickness uniformity, and/or amount of gas phase nucleation embedded within), allow materials to be used as a substrate that would otherwise produce an electrical arc in a plasma environment, allows surface energy modification (for example, surface wetting modification and/or liquid contact angle modification), or permit a combination thereof.

Referring to the Figure, a thermal chemical vapor deposition ("CVD") process 100 produces a treated article 101, for example, having features and properties unique to being produced through the thermal CVD process, according to the disclosure, which is a static process using an enclosed chamber or enclosed vessel 113 (for example, within the enclosed chamber) contrasted to flowable CVD that has concurrent flow of a precursor into and out of a chamber. As used herein, the phrase "thermal CVD" or "thermal chemical vapor deposition" refers to a reaction and/or decomposition of one or more gases, for example, in a starved reactor configuration, and is distinguishable from plasma-assisted CVD, radical-initiated CVD, and/or catalyst-assisted CVD, sputtering, atomic layer deposition (which is limited to a monolayer molecular deposition per cycle in contrast being capable of more than one layer of molecular deposition), and/or epitaxial growth (for example, growth at greater than 700° C.).

The treated article 101 is produced from an untreated article 111 and includes a substrate 103 (for example, not a silicon wafer) and one or more layers, such as, a base layer 105 in contact with the substrate 103, one or more interlayers 107 in contact with the base layer 105, and/or a surface layer 109 in contact with the interlayer 107 (or the outermost of the plurality of the interlayers 107). The term "untreated", as is used in describing the untreated article 111, refers to not having the complete deposition of the treated article 101 encompassed by the process 100. For example, embodiments of the process 100 include the untreated article 111 having an untreated substrate material, a treated substrate material, a cleaned substrate material, a treatment, a binder, an oxidation, any other suitable surface effect, or a combination thereof.

The base layer 105, the interlayer(s) 107, and/or the surface layer 109 included within the treated article 101 define a treatment 121, specifically, an oleophobic treatment. In some embodiments, the base layer 105 is also the surface layer 109. The treatment 121 is on the treated article 101 on regions that are unable to be concurrently treated through line-of-sight techniques. In a further embodiment, the treatment 121 is on regions that are unable to be treated concurrently or sequentially through line-of-sight techniques.

In one embodiment, the process 100 includes positioning one or a plurality of the untreated article(s) 111 within the enclosed vessel 113 (step 102). In further embodiments, the positioning (step 102) is manually with the untreated articles 111 being arranged in a vertical (stacked) orientation separated by supports (and thus obstructed from line-of-sight), arranged laterally or perpendicular to gravity (for example, with all or most openings being perpendicular to gravity), arranged in an overlapping manner that reduces the amount of volume available for gas phase nucleation, positioned in a fixture corresponding with the geometry of the untreated article(s) 111, or a combination thereof.

After the positioning (step 102), the process 100 includes introducing a precursor fluid (for example, liquid or gas, but not plasma) to the enclosed vessel 113 (step 104), for example, as a first aliquot, then soaking the untreated article(s) 111 (step 106) at a temperature above a reaction temperature (such as, the thermal decomposition temperature and/or a reaction promotion temperature) of the precursor fluid to produce the base layer 105 of the treated article 101. In one embodiment, the process 100 further includes repeating the introducing of the precursor fluid (step 104), for example, as a second aliquot, or introducing a different precursor fluid, to produce the interlayer(s) 107 and the surface layer 109. The soaking (step 106) is at a temperature above the reaction temperature of the precursor fluid or the different precursor fluid.

The treatment 121 has any suitable thickness providing the desired properties for the desired application. In one embodiment, the desired properties are selected from the group consisting of having a heterogeneous wetting regime, having a liquid-air composite system during hexadecane contact angle measurements, having a roughness ratio of substantially 1 (the roughness ratio being the true surface area of the treatment 121 divided by an apparent surface area during hexadecane contact angle measurement), having a greater thermal oxidation resistance than an identical treatment having a comparative thickness of greater than 700 nm, having a substantially identical hexadecane contact angle measurement compared to an identical treatment having a comparative thickness of greater than 700 nm, or a combination thereof. As used herein, for quantifiable values, the term "substantially" refers to having a tolerance plus or minus 3%.

In one embodiment, the thickness includes a diffusion depth penetrating the substrate 103. In another embodiment, the thickness includes a cumulative depth of the base layer 105, the interlayer(s) 107, and the surface layer 109. In yet another embodiment, the thickness includes the diffusion depth and the cumulative depth.

Suitable thicknesses include, but are not limited to, less than 600 nm, between 340 nm and 540 nm, less than 500 nm, 349 nm, 368 nm, 372 nm, 373 nm, 430 nm, 482 nm, 503 nm, 508 nm, 527 nm, 534 nm, between 300 nm and 600 nm, between 300 nm, and 550 nm, between 350 nm and 500 nm, between 400 nm and 500 nm, between 300 nm and 400 nm, or any suitable combination, sub-combination, range, or sub-range therein. Application of hexane to the oleophobic treatment shows inconsistent run-off from the oleophobic treatment illustrating a heterogeneous wetting regime.

The precursor fluid(es) is/are any suitable species capable of producing the treatment 121 through thermal reaction/decomposition. Gases may be gaseous or liquid at ambient temperature, so long as they thermally react/decompose within the process 100. The fluid(es) form a treatment gas 117 within the process 100.

Suitable gases to form or serve as the treatment gas 117 include, but are not limited to, silane, silane and ethylene, silane and an oxidizer, dimethylsilane, trimethylsilane, dialkylsilyl dihydride, alkylsilyl trihydride, non-pyrophoric species (for example, dialkylsilyl dihydride and/or alkylsilyl trihydride), thermally-reacted material (for example, carbosilane and/or carboxysilane, such as, amorphous carbosilane and/or amorphous carboxysilane), species capable of a recombination of carbosilyl (disilyl or trisilyl fragments), methyltrimethoxysilane, methyltriethoxysilane, dimethyldimethoxysilane, dimethyl di ethoxysilane, trimethylmethoxysilane, trimethylethoxysilane, one or more nitrogen-containing species (for example, ammonia, nitrogen, hydrazine, trisilylamine (also known as, TSA; silanamine; N,N-disilyl-disilazane; 2-silyl-; silane, nitrilotris; or 3SA), Bis(tertiary-butylamino)silane, 1,2-bis(dimethylamino)tetramethyldisilane, and/or dichlorosilane, hexachlorodisilane), and combinations thereof. In embodiments with more than one species being introduced, the species are introduced concurrently (pre-mixed or mixed in situ) or sequentially (with either species being introduced first).

In general, the gases used in the process 100 are each part of gaseous mixtures including thermally reactive gas(es) and an inert gas. Suitable concentrations of the thermally-reactive gas(es), by volume, are between 10% and 20%, between 10% and 15%, between 12% and 14%, between 10% and 100%, between 30% and 70%, between 50% and 80%, between 70% and 100%, between 80% and 90%, between 84% and 86%, or any suitable combination, sub-combination, range, or sub-range therein.

Suitable liquids include, but are not limited to, an organofluorotrialkoxysilane, an organofluorosilylhydride, an organofluoro silyl, a fluorinated alkoxysilane, a fluoroalkylsilane, a fluorosilane, or a combination thereof. Additionally or alternatively, specific embodiments include, but are not limited to, tridecafluoro 1,1,2,2-tetrahydrooctylsilane; (tridecafluoro-1,1,2,2-tetrahydrooctyl) triethoxysilane (also known as triethoxy (1H,1H,2H,2H-perfluoro-1-octyl) silane, triethoxy (3,3,4,4,5,5,6,6,7,7,8,8,8-tridecafluoro-1-octyl) silane, 1H,1H,2H,2H-perfluorooctyltriethoxysilane, or silane, triethoxy (3,3,4,4,5,5,6,6,7,7,8,8,8-tridecafluorooctyl)-); (perfluorohexylethyl) triethoxysilane; silane, (3,3,4,4,5,5,6,6,7,7,8,8,9,9,10,10,10-heptadecafluorodecyl) trimethoxy-; 1H,1H,2H,2H-perfluorodecyl trichlorosilane; 1H,1H,1H,2H-perfluorodecyl trimethoxysilane; 1H,1H,2H,2H-perfluorodecyltriethoxysilane; 1H,1H,2H,2H-perfluorooctyltrimethoxysilane; or a combination thereof. The liquids convert into the treatment gas 117 under the conditions of the process 100.

The process 100 is achieved at suitable temperatures and pressures to produce the treated article 101. In one embodiment, after the positioning of the untreated article(s) 111 within the enclosed vessel 113 (step 102), the temperature within the enclosed vessel 113 is increased from a temperature below the reaction/decomposition temperature of the treatment gas 117 to a temperature above the reaction/decomposition temperature of the treatment gas 117 prior to, during, and/or after the introducing of the treatment gas 117 (step 104). The introducing of the treatment gas 117 (step 104) is in a single cycle or multiple cycles, for example, with intermediate purges. In embodiments with multiple cycles, the introducing of the treatment gas 117 (step 104) is in two cycles, three cycles, four cycles, five cycles, six cycles, seven cycles, eight cycles, nine cycles, ten cycles, eleven cycles, twelve cycles, thirteen cycles, fourteen cycles, fifteen cycles, sixteen cycles, or any suitable combination, sub-combination, range, or sub-range therein.

In one embodiment, the temperature is greater than 200° C., greater than 300° C., greater than 350° C., greater than 370° C., greater than 380° C., greater than 390° C., greater than 400° C., greater than 410° C., greater than 420° C., greater than 430° C., greater than 440° C., greater than 450° C., greater than 500° C., between 300° C. and 450° C., between 350° C. and 450° C., between 380° C. and 450° C., between 300° C. and 500° C., between 400° C. and 500° C., or any suitable combination, sub-combination, range, or sub-range therein.

In one embodiment, the partial pressures for the treatment gas(es) 117 is/are between 1 Torr and 10 Torr, 1 Torr and 5 Torr, 1 Torr and 3 Torr, 2 Torr and 3 Torr, 10 Torr and 150 Torr, between 10 Torr and 30 Torr, between 20 Torr and 40 Torr, between 30 Torr and 50 Torr, between 60 Torr and 80 Torr, between 50 Torr and 100 Torr, between 50 Torr and 150 Torr, between 100 Torr and 150 Torr, less than 150 Torr, less than 100 Torr, less than 50 Torr, less than 30 Torr, or any suitable combination, sub-combination, range, or sub-range therein.

In one embodiment, the treatment gas(es) 117 is/are held at the temperature and the pressure for a period facilitating desired coverage. Suitable durations include, but are not limited to, at least 10 minutes, at least 20 minutes, at least 30 minutes, at least 45 minutes, at least 1 hour, at least 2 hours, at least 3 hours, at least 4 hours, at least 5 hours, at least 7 hours, between 10 minutes and 1 hour, between 20 minutes and 45 minutes, between 4 and 10 hours, between 6 and 8 hours, or any suitable combination, sub-combination, range, or sub-range therein.

Purging with an inert gas is capable of being performed to the enclosed vessel 113 during the process 100. For example, prior to or after the introducing of the treatment gas 117 (step 104) an inert gas is capable of being introduced to the enclosed vessel 113. Suitable inert gases include, but are not limited to, nitrogen, helium, and/or argon.

Oxidizing with an oxidant is capable of being performed to the enclosed vessel 113 during the process 100. For example, prior to or after the introducing of the treatment gas 117 (step 104) an oxidant is capable of being introduced to the enclosed vessel 113. Suitable oxidants include, but are not limited to, water (alone, with zero air, or with an inert gas), oxygen (for example, at a concentration, by weight, of at least 50%), air (for example, alone, not alone, and/or as zero air), nitrous oxide, ozone, peroxide, or a combination thereof. As used herein, the term "zero air" refers to atmospheric air having less than 0.1 ppm total hydrocarbons. The term "air" generally refers to a gaseous fluid, by weight, of mostly nitrogen, with the oxygen being the second highest concentration species within. For example, in one embodiment, the nitrogen is present at a concentration, by weight, of at least 70% (for example, between 75% and 76%) and oxygen is present at a concentration, by weight, of at least 20% (for example, between 23% and 24%).

The surface layer 109 is capable of being post-cleaned, for example, in a turbulent manner. Additionally or alternatively, cleaning techniques include water deionized flushing with sonication, polyethylene pellets to soak up dust, $CO_2$ spray, and/or use of a non-caustic chemical with good wetting/hydrophilicity (for example, hydrocarbon solvents, tetrahydrofuran, acetone, halogenated solvents, alcohols, such as, isopropanol, ammonium hydroxide+water).

The enclosed vessel(s) 113 has any dimensions or geometry that allows the treated article 101 to be produced within the temperature and the pressures. In one embodiment, the dimensions for the enclosed vessel(s) 113 include, but are not limited to, having a minimum width of greater than 5 cm, greater than 10 cm, greater than 20 cm, greater than 30 cm, greater than 100 cm, greater than 300 cm, greater than 1,000 cm, between 10 cm and 100 cm, between 100 cm and 300 cm, between 100 cm and 1,000 cm, between 300 cm and 1,000 cm, any other minimum width capable of uniform or substantially uniform heating, or any suitable combination, sub-combination, range, or sub-range therein. Suitable volumes for the enclosed vessel(s) 113 include, but are not limited to, at least 1,000 $cm^3$, greater than 3,000 $cm^3$, greater than 5,000 $cm^3$, greater than 10,000 $cm^3$, greater than 20,000 $cm^3$, between 3,000 $cm^3$ and 5,000 $cm^3$, between 5,000 $cm^3$ and 10,000 $cm^3$, between 5,000 $cm^3$ and 20,000 $cm^3$, between 10,000 $cm^3$ and 20,000 $cm^3$, any other volumes capable of uniform or substantially uniform heating, or any suitable combination, sub-combination, range, or sub-range therein.

Suitable components capable of being produced into the treated article 101 include, but are not limited to, fittings (for example, unions, connectors, adaptors, other connections between two or more pieces of tubing, for example, capable of making a leak-free or substantially leak-free seal), compression fittings (including ferrules, such as, a front and back ferrule), tubing (for example, coiled tubing, tubing sections such as used to connect a sampling apparatus, pre-bent tubing, straight tubing, loose wound tubing, tightly bound tubing, and/or flexible tubing, whether consisting of the interior being treated or including the interior and the exterior being treated), valves (such as, gas sampling, liquid sampling, transfer, shut-off, or check valves, for example, including a rupture disc, stem, poppet, rotor, multi-position configuration, able to handle vacuum or pressure, a handle or stem for a knob, ball-stem features, ball valve features, check valve features, springs, multiple bodies, seals, needle valve features, packing washers, and/or stems), quick-connects, sample cylinders, regulators and/or flow-controllers (for example, including o-rings, seals, and/or diaphragms), injection ports (for example, for gas chromatographs), in-line filters (for example, having springs, sintered metal filters, mesh screens, and/or weldments), glass liners, gas chromatograph components, liquid chromatography components, components associated with vacuum systems and chambers, components associated with analytical systems, sample probes, control probes, downhole sampling containers, drilled and/or machined block components, manifolds, particles, powders, needles, probes, reaction chambers, reaction vessels, laboratory equipment, piping, automotive components, machining components, oil and gas processing and transfer equipment, other similar articles, or a combination thereof. Additionally or alternatively, in some embodiments, the treated article(s) 111 include consumer goods, such as, cookware (pots, pans, lids, mesh splash guards), kitchenware, oven and/or stove components (for example, racks and heating coils), cooking utensils (forks, knives, spoons, spatulas, serving ware, etc.), kitchen thermometers, other similar articles, or a combination thereof In one embodiment, the untreated article 111, and thus, the treated article 101 has a non-planar geometry. Exemplary non-planar geometries include having features selected from the group consisting of channels, curves, threading, vanes, protrusions, cavities, junctions, mating interfaces, and combinations thereof. In a further embodiment, all exposed surfaces of the treated article 101 include the base layer 105, the interlayer(s) 107, and the surface layer 109. As used herein, the term "exposed," with regard to "exposed surfaces," refers to any surface that is in contact with gas during the process, and is not limited to line-of-site surfaces or surfaces proximal to line-of-site directions as are seen in flow-through chemical vapor deposition processes that do not have the enclosed vessel 113. As will be appreciated by those skilled in the art, the treated article 101 is capable of being incorporated into a larger component or system (not shown), whether the larger component or the system includes other treated article 101 or not.

The substrate 103 is any suitable material(s) compatible with the process 100. Suitable metal or metallic materials include, but are not limited to, ferrous-based alloys, non-ferrous-based alloys, nickel-based alloys, stainless steels (martensitic or austenitic), aluminum alloys, composite metals, or combinations thereof. Suitable non-metal or non-metallic materials include, but are not limited to, ceramics, glass, ceramic matrix composites, or a combination thereof. Suitable materials may be tempered or non-tempered; may have grain structures that are equiaxed, directionally-solidified, and/or single crystal; may have amorphous or crystalline structures; may be foil, fibrous, polymeric, film and/or treated; or may have any suitable combination or sub-combination thereof that is capable of withstanding the operational temperatures of the process 100.

In one embodiment, the substrate 103 is or includes a composition, by weight, of up to 0.08% carbon, between 18% and 20% chromium, up to 2% manganese, between 8% and 10.5% nickel, up to 0.045% phosphorus, up to 0.03% sulfur, up to 1% silicon, and a balance of iron (for example, between 66% and 74% iron).

In one embodiment, the substrate 103 is or includes a composition, by weight, of up to 0.08% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the substrate 103 is or includes a composition, by weight, of up to 0.03% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the substrate 103 is or includes a composition, by weight, of between 14% and 17% chromium, between 6% and 10% iron, between 0.5% and 1.5% manganese, between 0.1% and 1% copper, between 0.1% and 1% silicon, between 0.01% and 0.2% carbon, between 0.001% and 0.2% sulfur, and a balance nickel (for example, 72%).

In one embodiment, the substrate 103 is or includes a composition, by weight, of between 20% and 24% chromium, between 1% and 5% iron, between 8% and 10% molybdenum, between 10% and 15% cobalt, between 0.1% and 1% manganese, between 0.1% and 1% copper, between 0.8% and 1.5% aluminum, between 0.1% and 1% titanium, between 0.1% and 1% silicon, between 0.01% and 0.2% carbon, between 0.001% and 0.2% sulfur, between 0.001% and 0.2% phosphorus, between 0.001% and 0.2% boron, and a balance nickel (for example, between 44.2% and 56%).

In one embodiment, the substrate 103 is or includes a composition, by weight, of between 20% and 23% chromium, between 4% and 6% iron, between 8% and 10% molybdenum, between 3% and 4.5% niobium, between 0.5% and 1.5% cobalt, between 0.1% and 1% manganese, between 0.1% and 1% aluminum, between 0.1% and 1% titanium, between 0.1% and 1% silicon, between 0.01% and 0.5% carbon, between 0.001% and 0.02% sulfur, between 0.001% and 0.02% phosphorus, and a balance nickel (for example, 58%).

In one embodiment, the substrate 103 is or includes a composition, by weight, of between 25% and 35% chromium, between 8% and 10% iron, between 0.2% and 0.5% manganese, between 0.005% and 0.02% copper, between 0.01% and 0.03% aluminum, between 0.3% and 0.4% silicon, between 0.005% and 0.03% carbon, between 0.001% and 0.005% sulfur, and a balance nickel (for example, 59.5%).

In one embodiment, the substrate 103 is or includes a composition, by weight, of between 17% and 21%, between 2.8% and 3.3%, between 4.75% and 5.5% niobium, between 0.5% and 1.5% cobalt, between 0.1% and 0.5% manganese, between 0.2% and 0.8% copper, between 0.65% and 1.15% aluminum, between 0.2% and 0.4% titanium, between 0.3% and 0.4% silicon, between 0.01% and 1% carbon, between 0.001 and 0.02% sulfur, between 0.001 and 0.02% phosphorus, between 0.001 and 0.02% boron, and a balance nickel (for example, between 50% and 55%).

In one embodiment, the substrate 103 is or includes a composition, by weight, of between 2% and 3% cobalt, between 15% and 17% chromium, between 5% and 17% molybdenum, between 3% and 5% tungsten, between 4% and 6% iron, between 0.5% and 1% silicon, between 0.5% and 1.5% manganese, between 0.005 and 0.02% carbon, between 0.3% and 0.4% vanadium, and a balance nickel.

In one embodiment, the substrate 103 is or includes a composition, by weight, of up to 0.15% carbon, between 3.5% and 5.5% tungsten, between 4.5% and 7% iron, between 15.5% and 17.5% chromium, between 16% and 18% molybdenum, between 0.2% and 0.4% vanadium, up to 1% manganese, up to 1% sulfur, up to 1% silicon, up to 0.04% phosphorus, up to 0.03% sulfur, and a balance nickel.

In one embodiment, the substrate 103 is or includes a composition, by weight, of up to 2.5% cobalt, up to 22% chromium, up to 13% molybdenum, up to 3% tungsten, up to 3% iron, up to 0.08% silicon, up to 0.5% manganese, up to 0.01% carbon, up to 0.35% vanadium, and a balance nickel (for example, 56%).

In one embodiment, the substrate 103 is or includes a composition, by weight, of between 1% and 2% cobalt, between 20% and 22% chromium, between 8% and 10% molybdenum, between 0.1% and 1% tungsten, between 17% and 20% iron, between 0.1% and 1% silicon, between 0.1% and 1% manganese, between 0.05 and 0.2% carbon, and a balance nickel.

In one embodiment, the substrate 103 is or includes a composition, by weight, of between 0.01% and 0.05% boron, between 0.01% and 0.1% chromium, between 0.003% and 0.35% copper, between 0.005% and 0.03% gallium, between 0.006% and 0.8% iron, between 0.006% and 0.3% magnesium, between 0.02% and 1% silicon+iron, between 0.006% and 0.35% silicon, between 0.002% and 0.2% titanium, between 0.01% and 0.03% vanadium+titanium, between 0.005% and 0.05% vanadium, between 0.006% and 0.1% zinc, and a balance aluminum (for example, greater than 99%).

In one embodiment, the substrate 103 is or includes a composition, by weight, of between 0.05% and 0.4% chromium, between 0.03% and 0.9% copper, between 0.05% and 1% iron, between 0.05% and 1.5% magnesium, between 0.5% and 1.8% manganese, between 0.5% and 0.1% nickel, between 0.03% and 0.35% titanium, up to 0.5% vanadium, between 0.04% and 1.3% zinc, and a balance aluminum (for example, between 94.3% and 99.8%).

In one embodiment, the substrate 103 is or includes a composition, by weight, of between 0.0003% and 0.07% beryllium, between 0.02% and 2% bismuth, between 0.01% and 0.25% chromium, between 0.03% and 5% copper, between 0.09% and 5.4% iron, between 0.01% and 2% magnesium, between 0.03% and 1.5% manganese, between 0.15% and 2.2% nickel, between 0.6% and 21.5% silicon, between 0.005% and 0.2% titanium, between 0.05% and 10.7% zinc, and a balance aluminum (for example, between 70.7% to 98.7%).

In one embodiment, the substrate 103 is or includes a composition, by weight, of between 0.15% and 1.5% bismuth, between 0.003% and 0.06% boron, between 0.03% and 0.4% chromium, between 0.01% and 1.2% copper, between 0.12% and 0.5% chromium+manganese, between 0.04% and 1% iron, between 0.003% and 2% lead, between 0.2% and 3% magnesium, between 0.02% and 1.4% manganese, between 0.05% and 0.2% nickel, between 0.5% and 0.5% oxygen, between 0.2% and 1.8% silicon, up to 0.05% strontium, between 0.05% and 2% tin, between 0.01% and 0.25% titanium, between 0.05% and 0.3% vanadium, between 0.03% and 2.4% zinc, between 0.05% and 0.2% zirconium, between 0.150 and 0.2% zirconium+titanium, and a balance of aluminum (for example, between 91.7% and 99.6%).

In one embodiment, the substrate 103 is or includes a composition, by weight, of between 0.4% and 0.8% silicon, up to 0.7% iron, between 0.15% and 0.4% copper, up to 0.15% manganese, between 0.8% and 1.2% magnesium, between 0.04% and 0.35% chromium, up to 0.25% zinc, up to 0.15% titanium, optional incidental impurities (for example, at less than 0.05% each, totaling less that 0.15%), and a balance of aluminum (for example, between 95% and 98.6%).

In one embodiment, the substrate 103 is or includes a composition, by weight, of between 11% and 13% silicon, up to 0.6% impurities/residuals, and a balance of aluminum.

EXAMPLES

In a first example, a comparative example, a stainless steel substrate, treated by an oleophobic treatment of an oxidized then fluoro-functionalized dimethylsilane thermal chemical vapor deposition treatment is tested. The thickness measurements are 673 nm, 682 nm, 684 nm, 750 nm, 798 nm, 845 nm, 952 nm, and 990 nm. Application of hexane to the oleophobic treatment shows consistent run-off from the oleophobic treatment illustrating a homogeneous wetting regime.

In a second example, corresponding with an embodiment of the disclosure, a stainless steel substrate, treated by an oleophobic treatment of an oxidized then fluoro-functionalized dimethylsilane thermal chemical vapor deposition treatment is tested. The thickness measurements are 349 nm, 368 nm, 372 nm, 373 nm, 430 nm, 482 nm, 503 nm, 508 nm, 527 nm, and 534 nm. Application of hexane to the oleophobic treatment shows inconsistent run-off from the oleophobic treatment illustrating a heterogeneous wetting regime.

In a third example, another comparative example, a stainless steel substrate, a comparative treatment from an oxidized then (non-fluoro) functionalized dimethylsilane thermal chemical vapor deposition treatment is tested. The thickness measurements are 493 nm, 644 nm, 874 nm, 906 nm, and 931 nm. Application of hexane to the comparative treatment shows consistent run-off illustrating a homogeneous wetting regime.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:
1. A thermal chemical vapor deposition treated article, comprising:
a substrate; and
an oleophobic treatment to all exposed surfaces of the substrate, the oleophobic treatment having oxygen, carbon, silicon, fluorine, and hydrogen;

wherein the oleophobic treatment has a treatment thickness of less than 600 nm and a heterogeneous wetting regime.

2. The article of claim 1, wherein the oleophobic treatment is an oxidized then fluoro-functionalized dimethylsilane chemical vapor deposition treatment.

3. The article of claim 1, wherein the oleophobic treatment has greater thermal oxidation resistance than an identical treatment having a comparative thickness of greater than 700 nm.

4. The article of claim 1, wherein the oleophobic treatment has a substantially identical hexadecane contact angle measurement to an identical treatment having a comparative thickness of greater than 700 nm.

5. The article of claim 1, wherein the oleophobic treatment has a thickness of between 340 nm and 540 nm.

6. The article of claim 1, wherein the oleophobic treatment has a thickness of less than 500 nm.

7. The article of claim 1, wherein the oleophobic treatment has a liquid-air composite system during hexadecane contact angle measurements.

8. The article of claim 1, wherein the substrate is a stainless steel.

9. The article of claim 1, wherein the substrate is an aluminum alloy.

10. The article of claim 1, wherein the substrate is a material susceptible to arcing in a plasma environment.

11. The article of claim 1, wherein the article has a three-dimensional profile, the three-dimensional profile having obscured regions obstructed from line-of-sight, and the oleophobic treatment is positioned on the obscured regions.

12. The article of claim 1, wherein the article is a fitting.

13. The article of claim 1, wherein the article is tubing or piping.

14. The article of claim 1, wherein the article is a valve, injection port, or probe.

15. The article of claim 1, wherein the article is a vessel or chamber.

16. The article of claim 1, wherein the article is a filter.

17. The article of claim 1, wherein the article is an automotive component.

* * * * *